(12) United States Patent
Draggie et al.

(10) Patent No.: US 6,900,641 B2
(45) Date of Patent: May 31, 2005

(54) SWITCH TESTING APPARATUS

(75) Inventors: Raymond Q. Draggie, Spokane, WA (US); Scott D. Maxwell, Renton, WA (US); James I. Murphy, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/619,049

(22) Filed: Jul. 14, 2003

(65) Prior Publication Data

US 2005/0012504 A1 Jan. 20, 2005

(51) Int. Cl.$^7$ .............................................. G01R 31/02
(52) U.S. Cl. ................... 324/418; 324/415; 73/862.381
(58) Field of Search ............................... 324/415–424; 73/862.381

(56) References Cited

U.S. PATENT DOCUMENTS 5,117,189 A * 5/1992 Terminiello et al. ........ 324/415
5,388,467 A * 2/1995 Jereb et al. ............ 73/862.381

* cited by examiner

Primary Examiner—Vincent Q. Nguyen
(74) Attorney, Agent, or Firm—Alston & Bird LLP

(57) ABSTRACT

An apparatus for testing a switch is provided that permits the performance of a switch to be reliably tested and to precisely determine a host of parameters that collectively define the performance of the switch. The apparatus includes a stage upon which the switch is mounted. The apparatus also includes an actuator for actuating the switch and a positioning device, such as a micrometer, for controllably positioning at least one of the actuator and the stage such that the actuator actuates the switch. The apparatus may also include a measurement device for monitoring the electrical condition of the switch as its state is altered. For example, the measurement device may monitor a measure representative of the electrical resistance such as voltage drop across at least two contacts of the switch. Additionally, the measurement device may monitor travel of at least one of the actuator and the stage.

26 Claims, 3 Drawing Sheets

SWITCH TESTING APPARATUS

FIELD OF THE INVENTION

The present invention relates generally to an apparatus for testing a switch and, more particularly, to an apparatus for precisely monitoring the electrical condition of a switch as the state of the switch is controllably altered.

BACKGROUND OF THE INVENTION

There are a number of different types of switches. One common type of switch is a plunger-type of switch, such as a push button switch or the like, that includes a plunger that is alternately depressed and released to actuate the switch. Other types of switches include inductive and Hall effect switches which are magnetically actuated. In this regard, inductive switches are generally actuated by an oscillating magnetic field, while Hall effect switches are generally actuated by a static magnetic field. Since the actuation of a plunger-type switch is dictated by the position of the plunger and the actuation of inductive and Hall effect switches is dictated by the strength and, at least in part, the position of the switch relative to the source of the magnetic field, each of these switches relies upon travel dependent switch actuation.

In addition to the type of actuation, switches can be categorized by the number of poles. Commonly a switch is either a single pole switch or a double pole switch, although switch design is not limited to only these configurations. A single pole switch is usually either a single pole, single throw or single pole, double throw. The internal configuration generally consists of a common contact paired with either a normally closed contact, normally open contact or both. In contrast, a double throw switch can have two, four or more movable common contacts with a corresponding number of normally closed and or normally open contacts. Thus, the initial actuation of a double throw switch would generally break the contact between the common contact(s) and the normally closed contact(s); with further actuation of the double throw switch plunger, establishing or making contact between the common contact(s) and the normally open contact(s).

Switches are used in a wide variety of different applications. For example, control panels, such as those employed by aircraft, space craft, automobiles and other vehicles, marine vehicles, industrial facilities and the like, often include a plurality of switches for providing certain types of information to the system based upon the state of the switch, such as closed or open. Switches are also often frequently used as limit switches and as interlocks in control and awareness systems.

It is desirable to test the performance of switches. For example, it may be desirable to test the performance of a switch prior to its installation so as to thereby qualify the switch. It may also be desirable to test the switch at one or more times during the lifetime of the switch to ensure that the switch is continuing to operate properly and to identify any changes in the performance of the switch over time. Finally, it may be desirable to test the performance of the switch following the failure of a system of which the switch is a portion.

Unfortunately, typical techniques for testing switches have been quite rudimentary and have generally only been performed during the design or initial qualification of a switch. Moreover, the conventional testing practices for switches have provided only limited information regarding the performance of a switch and may have somewhat questionable accuracy or at least less precision than is desired in certain demanding applications.

BRIEF SUMMARY OF THE INVENTION

An apparatus for testing a switch is therefore provided that permits the performance of a switch to be reliably tested and to precisely determine a host of parameters that collectively define the performance of the switch. As such, the apparatus of the present invention is suitable for testing the performance of a switch during the initial qualification of a switch, at one or many times during the lifetime of a switch and following the failure of the switch or the system in which the switch is deployed. Because of the precision of the data collected by the apparatus of the present invention and the number of different performance parameters that are monitored by the apparatus of the present invention, the apparatus of the present invention permits significant intelligence to be gathered regarding a switch that can be utilized for a wide variety of purposes including qualification and trouble-shooting.

The apparatus of the present invention includes a stage upon which the switch is mounted. In one embodiment, the stage is one component of a mounting assembly that also includes a base and an upstanding member mounted upon the base. The upstanding member of this embodiment is adapted to move in the first direction relative to the base. The stage, in turn, is mounted to the upstanding member and adapted to move in a second direction relative to the upstanding member. Thus, the mounting assembly of this embodiment permits the stage, and in turn, the switch carried by the stage to be controllably positioned in at least two axes.

The apparatus of the present invention also includes an actuator for actuating the switch to thereby alter the state of the switch, such as by causing a switch that is normally closed to open, or visa versa. In one embodiment, the actuator comprises an actuation shaft that actuates the switch. In order to measure the force applied to the switch to facilitate its actuation, the actuation shaft may include a load cell. The embodiments in which the switch that is under test is a magnetically actuated switch, such as an inductive switch or a Hall effect switch, the actuator may include a magnetic field generator for actuating the switch.

The apparatus also includes a positioning device for controllably positioning at least one of the actuator and the stage such that the actuator actuates the switch, i.e., causes the switch to change states. In one embodiment, the positioning device includes a micrometer for controllably positioning the actuator relative to the switch. In this embodiment, the actuator and the micrometer may collectively comprise a micrometer assembly that may be commonly mounted upon the base of the mounting assembly. In this embodiment, the micrometer not only positions the actuator, but also provides an indication of the position of the actuator, such as at the time of switch activation. In another embodiment, the position measurement is made electrically with an optically linked or mechanically connected transducer, between the stage and the actuator, providing an electrical signal representative of the position of the actuator, such as at the time of switch actuation.

The apparatus may also include a measurement device for monitoring the electrical condition of the switch as the state of the switch is altered. For example, the measurement device may monitor a measure representative of the electrical resistance, such as voltage drop or electrical current conduction, between at least two contacts of the switch. Additionally, the measurement device may monitor travel of the actuator and/or the stage. Thus, the extent of the travel required to alter state of the switch, such as from closed to open or visa versa, can be determined. A measurement device may also monitor hysterisis of the switch as the state of the switch is again altered so as to return to an initial state. Thus, variations in the performance of the switch as the state of the switch is toggled may be measured. Further, in embodiments in which the switch is a single pole or double pole switch, the measurement device may also monitor the pre-travel, differential travel, and over-travel of the switch.

Accordingly, the apparatus of the various embodiments of the present invention permits a switch to be tested in a precise and detailed manner. In this regard, a host of parameters that characterize the performance of the switch can be measured in a precise manner at one or more times prior to, during and following the operational life of the switch so as to provide increased intelligence regarding the performance of the switch.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF FURTHER EMBODIMENTS

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Figure 1:
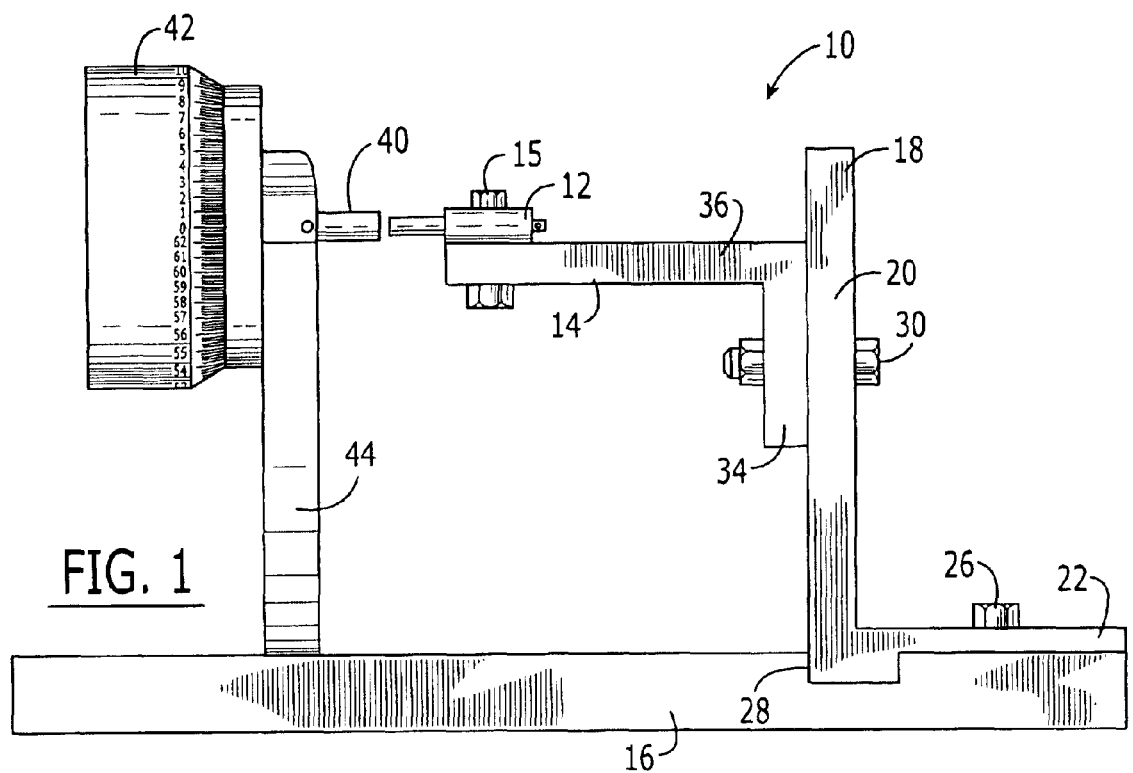
FIG. 1 is a side view of an apparatus for testing a switch including to one embodiment of the present invention.
Figure 2:
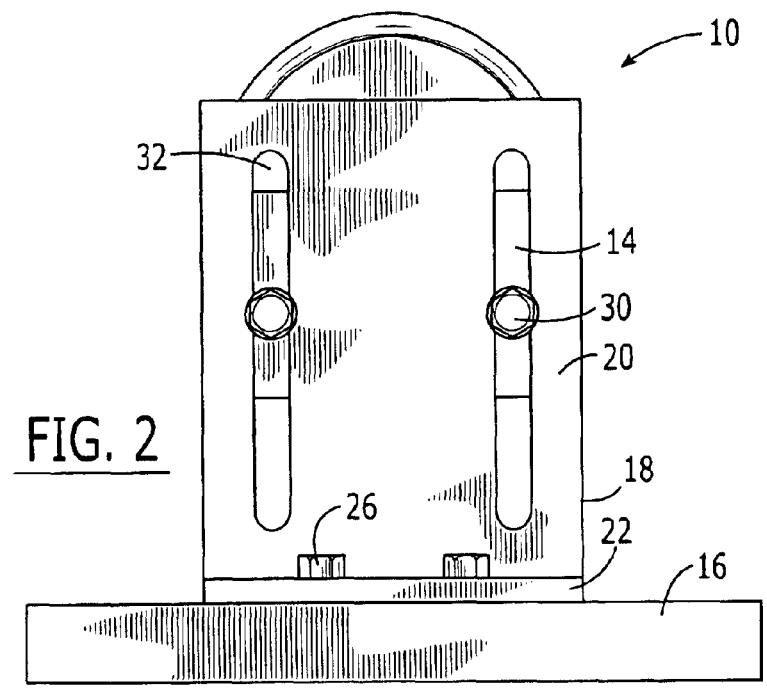
FIG. 2 is a perspective view of the test apparatus of FIG. 1 from one end thereof.
Figure 3:
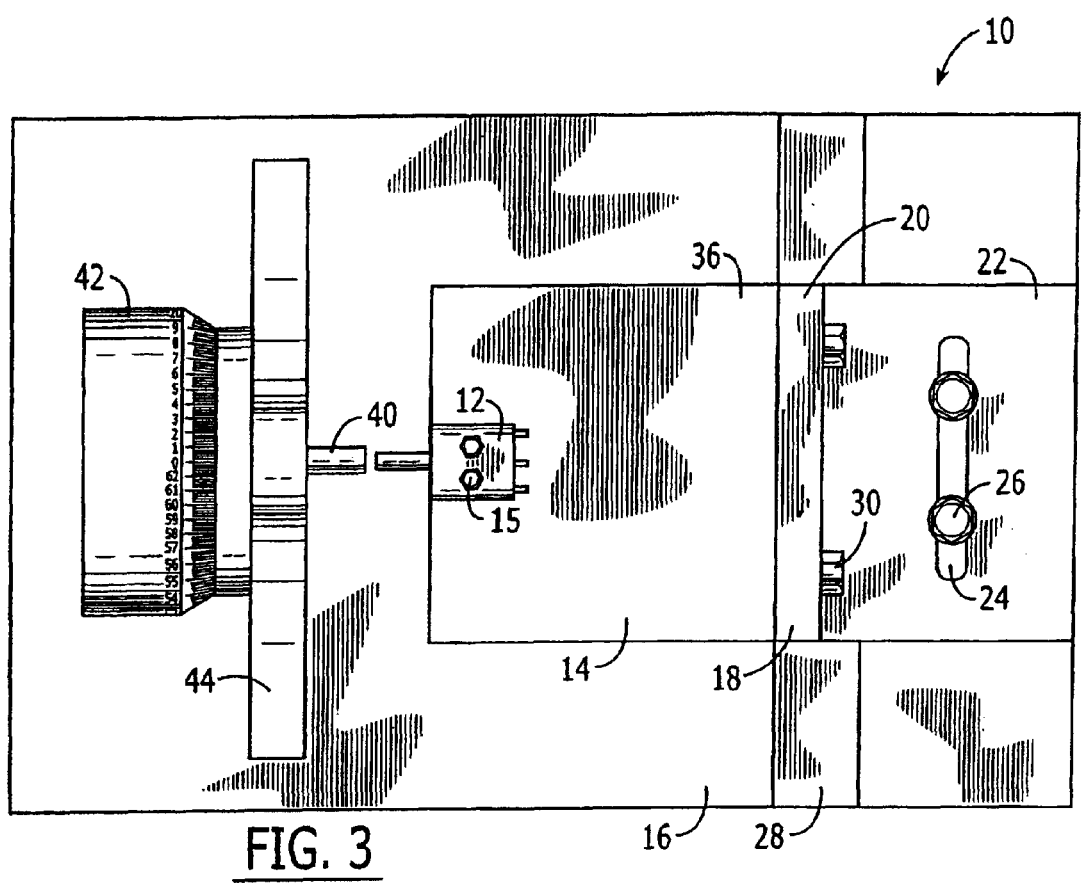
FIG. 3 is a top view of the test apparatus of FIG. 1.

Referring now to FIGS. 1–3, an apparatus 10 for testing a switch 12 according to one embodiment of the present invention is depicted. The test apparatus may be utilized to test a wide variety of switches. For example, the apparatus may test single pole or multiple pole switches. In this regard, the testing of a single pole switch and a double pole switch will be described by way of an example hereinbelow. Regardless of the poles of the switch, the apparatus of the present invention is capable of testing switches that are actuated in different manners, such as push button-type switches that include a plunger that are actuated by the application of physical force to the plunger which causes the linear displacement of the plunger that is required to alter the state of the switch, as well as magnetically actuated switches, such as inductive or Hall effect switches, that are actuated by the application of a magnetic field.

As shown, the apparatus 10 includes a stage 14 on which the switch 12 is mounted. The switch may be mounted upon the stage in a variety of manners so long as the switch is maintained in a fixed or otherwise predefined position upon the stage. Commonly, the switch has one or more openings therethrough for receiving respective connectors, such as bolts, screws, etc., in order to permit the switch to be installed within a control panel or the like. These same openings defined by the switch may be utilized to mount the switch to the stage. In this regard, the stage may also define a pair of openings that are aligned with respective openings defined by the switch such that connectors 15 may be extended through the aligned openings in order to securely mount the switch to the stage. Upon the conclusion of the test, however, the connectors can be removed in order to remove the switch from the stage.

As shown in FIGS. 1–3, the stage 14 may be one component of a mounting assembly that permits the switch 12 to be controllably positioned in at least two axes. In addition to the stage, the mounting assembly includes a base 16 and an upstanding member 18 mounted upon the base. The upstanding member may be adapted for movement in a first direction relative to the base. While the relative motion between the base and the upstanding member may be provided in various manners, the upstanding member of the illustrated embodiment has a generally L-shape and is comprised of a riser 20 that extends away from the base and a support portion 22 that generally rests upon the base. The support portion of the upstanding member of the illustrated embodiment may define a transverse slot 24. Correspondingly, the base of the illustrated embodiment may define one or more openings aligned with the slot defined by the support portion of the upstanding member. By extending connectors 26, such as bolts, through the slot and respective openings defined by the base, the relative movement of the upstanding member relative to the base can generally be limited to movement in the transverse direction in which the slot extends.

While the connectors 26 are loosely placed through the slot and the respective openings defined by the base 16, the upstanding member 18 can be positioned in the desired transverse position relative to the base. Once properly positioned, the connectors may be tied to thereby secure the upstanding member to the base. In order to further limit the movement of the upstanding member relative to the base to movement in the transverse direction, the base may define a transversely extending groove 28 and the upstanding member, and, in particular, the support portion 22 of the upstanding member may include a transversely extending rib or projection that snuggly fits within the groove, thereby further limiting relative movement of the upstanding member with respect to the base to movement in the transverse direction.

As was also shown in FIGS. 1–3, the stage 14 which carries the switch 12 is mounted to the upstanding member 18. The stage is adapted for movement in a second direction relative to the upstanding member. As described in more detail below, the second direction is generally perpendicular to the first direction so as to permit the switch mounted upon the stage to be controllably positioned along two mutually perpendicular axes. While the stage may be mounted to and adapted for movement relative to the upstanding member in a variety of manners, the mounting assembly of the illustrated embodiment again employs connectors 30, such as bolts, that extend through respective slots 32 defined by the riser 20 of the upstanding member and respective openings defined by the stage.

In this regard, the stage 14 of the illustrated embodiment may also have a generally L-shape, including an upstanding portion 34 and a support portion 36. As shown, the switch 12 may be mounted upon the support portion of the stage, with the upstanding portion of the stage and the riser 20 positioned proximate to and generally in contact with one another. In the illustrated embodiment, the riser of the upstanding member defines at least one and, more commonly, two or more slots 32 extending in the second direction. Correspondingly, the upstanding portion of the stage defines one or more openings aligned with respective slots of the riser. Thus, connectors 30, such as bolts, may be extended through each slot defined by the riser and through the respective opening defined by the upstanding portion of the stage, thereby restricting the movement of the stage relative to the upstanding member to movement in the second direction. Thus, the stage, and, in particular, the switch carried by the stage can be properly positioned in the second direction and the bolts can then be tightened so as to fix the relative position of the stage with respect to the upstanding member. Thus, the stage, and, in particular, the switch carried by the stage can be controllably positioned in at least two directions and the switch can then be secured in a desired position.

While one embodiment of a mounting assembly is shown and has been described hereinabove, the apparatus 10 of the present invention may include a wide variety of other mounting assemblies. For example, a mounting assembly much like that depicted in FIGS. 1–3 may be utilized in which the upstanding member 18 does not define the slots 24, 32, but instead the stage 14 and the base 16 may define the slots through which the connectors extend, while the upstanding member either defines respective openings. As another example, the stage could define transversely extending slots for receiving the connectors 15 that extend through the openings defined by the switch 12 such that the switch can be appropriately positioned upon the stage without requiring that the upstanding member 18 be capable of transverse movement relative to the base 16.

Figure 4:
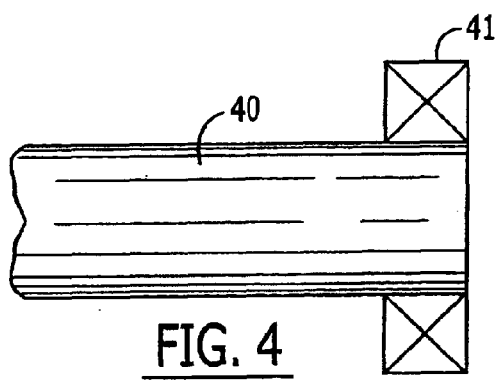
FIG. 4 is a fragmentary perspective view of an actuator according to one embodiment of the present invention that includes a magnetic field generator in the form of a magnet.

The apparatus 10 of the present invention also includes an actuator 40 for actuating the switch 12, thereby altering the state of the switch from "off" to "on", or visa versa. In this regard, actuation of the switch will break a normally closed switch so as to now be open, or, conversely, will make a normally open switch so as to now be closed, thereby altering the state of the switch. While the actuator can be embodied in various different manners, the actuator of the illustrated embodiment comprises an actuation shaft, such as linear rod. In instances in which the apparatus is utilized to test a pushbutton or plunger-type switch, the actuation shaft is brought into contact with the plunger of the switch so as to depress the plunger and alter the state of the switch. Alternatively, in instances in which the apparatus is utilized to test a magnetically actuated switch, such as an inductive or a Hall effect switch, the actuator is not actually brought into physical contact with the switch. Instead, the actuator includes a magnetic field generator 41 for actuating the switch. As shown, for example, in FIG. 4, the magnetic generator may include a magnet, such as a permanent magnet, mounted upon an actuation shaft. An actuator, such as that depicted in FIG. 4, that includes a permanent magnet would be effective to actuate a Hall effect sensor that switches based upon a static magnetic field, such as that generated by a permanent magnet. Alternatively, the magnetic field generator of the actuator may generate an oscillating magnetic field, such as to actuate an inductive switch, if so desired. Regardless of the type of magnet field generator, the actuator of these embodiments is typically not brought into physical contact with the switch. Instead, the actuator is merely moved toward the switch so as to reduce the air gap between the magnetic field generator and the switch, which in turn, will cause the state of the switch to change.

The test apparatus 10 also includes a positioning device 42 for controllably positioning at least one of the actuator 40 and the stage 14 relative to the other such that the actuator actuates the switch. As described hereinbelow, the positioning device typically positions the actuator relative to the stage. Thus, in this embodiment, once the stage is properly positioned in the first and second directions, the position of the stage and, in turn, the switch 12 carried by the stage is fixed in position while the positioning device controllably positions the actuator relative thereto. However, the positioning device may, instead, move the stage relative to the actuator, while the actuator remains fixed in position. Still further, the positioning device may move both the actuator and the stage relative to one another, if so desired.

Preferably, the positioning device 42 provides relatively precise positioning of the actuator 40 in order to increase the precision of the performance parameters collected by the test apparatus 10, as described below. In the illustrated embodiment, the positioning device includes a micrometer from which the actuation shaft extends outwardly. As known to those skilled in the art, a micrometer generally includes a linkage that is connected to a slide upon which the actuation shaft is mounted. The linkage converts the rotational movement of the micrometer to a precise linear motion. The micrometer permits precise positioning of the actuator, such as an actuation shaft, relative to the switch 12. In this embodiment the actuation shaft and the micrometer may collectively comprise a micrometer assembly. As shown in FIGS. 1–3, the micrometer assembly may also be mounted upon the base 16 of the mounting assembly so as to provide a common frame of reference for both the actuation shaft and the switch carried by the stage. As such, the micrometer assembly may also include a micrometer stand 44, typically comprised of an upstanding member upon which the micrometer is mounted and which, in turn, is mounted in a fixed position to the base.

While a micrometer is capable of precisely positioning the actuator, the positioning device 42 can be embodied in other manners. For example, the positioning device may include a slide that is controllably positioned by means of an x-y table. The slide carries or is otherwise connected to the actuator 40 such that the actuator can be precisely positioned relative to the switch 12. The positioning device may also include a device for determining the position of the actuator. For example, a laser displacement sensor or a linear variable differential transformer (LVDT) may be utilized to monitor the position of the actuator in a precise manner, providing an electrical output proportional to position.

The test apparatus 10 may also include a measurement device 46 for monitoring various parameters associated with the switch 12 as the state of the switch is altered as a result of actuation of the switch by the actuator 40. Among other parameters, the measurement device advantageously monitors the electrical condition of the switch as the state of the switch is altered. In one embodiment, the measurement device comprises a multimeter. However, the measurement device can include a wide variety of other devices capable of monitoring the electrical condition of the switch as the state of the switch is altered. Further details regarding the measurement device and the general operation of the test apparatus are described hereinbelow in conjunction with the testing of a single pole, double throw switch.

Figure 5:
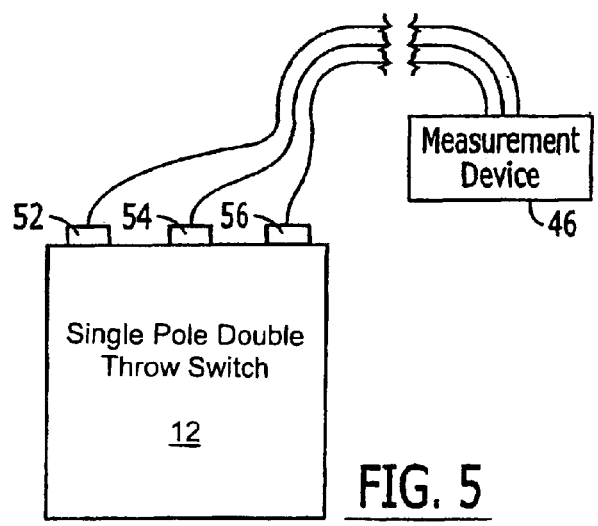
FIG. 5 is a schematic representation of a single or double pole switch, which illustrates the electrical connection of a measurement device of the test apparatus of one embodiment to the present invention to the normally closed, common and normally open contacts of the single or double pole switch.

As shown in FIG. 5, a single pole, double throw switch 12 has three contacts, namely, a normally closed contact 52, a common contact 54 and a normally open contact 56. The measurement device and, more particularly, leads from the measurement device are typically connected to each of the contacts of the single pole, double throw switch. During testing of a plunger-type single pole, double throw switch, an actuator 40, such as an actuation shaft, is brought into contact with the plunger of the single pole, double throw switch. The actuator is then further advanced so as to depress the plunger. The electrical condition of the switch is monitored as the plunger is depressed. Prior to actuation, for a single pole, double throw switch of this type, the electrical resistance between the normally closed and the common contacts is generally very small or is zero, while the electrical resistance between the normally open and common contacts is generally very high or infinite. In some instances resistances will not be in the advertised range and will be detected in relation to position by the testing apparatus of the present invention.

After the initial depression of the plunger, the connection between the normally closed and common contacts 52, 54 will be broken if the switch 12 is operating properly. The breaking of the connection between the normally closed and common contacts can be detected generally by a relatively sudden and marked increase in the electrical resistance between the normally closed and common contacts, such as from a relatively low value or a value of zero to a relatively high value. The travel, i.e., the linear movement, of the actuator 40 between the time at which the actuation shaft first made physical contact with the switch, such as the plunger of the switch, and the time at which the connection between the normally closed and common contacts of the double pole switch is broken is defined as the pre-travel of the switch.

The positioning device 42 continues to advance the actuator 40 such that a connection between the normally open and common contacts 56, 54 is subsequently made. The making of the connection between the normally open and common contacts can generally be detected by a marked and sudden decrease in the electrical resistance between the normally open and common contacts, such as from a high or infinite resistance to a relatively low resistance or a resistance of zero. As before, the travel of the actuation shaft between the time at which the connection between the normally closed and common contacts 52, 54 is broken and the time at which the connection between the normally open and common contacts is made is referred to as snap-over. The distance between the snap-over and when the contacts snap-back or release is also measured and is defined to be the differential travel of the switch. Typically, the positioning device continues to advance the actuator after switch snap-over until no further advancement of the actuator is permitted, such as by bottoming out of the plunger. The additional travel of the actuation shaft once a connection between the normally open and common contacts has been made is also monitored and is termed the over travel of the switch.

Figure 6:
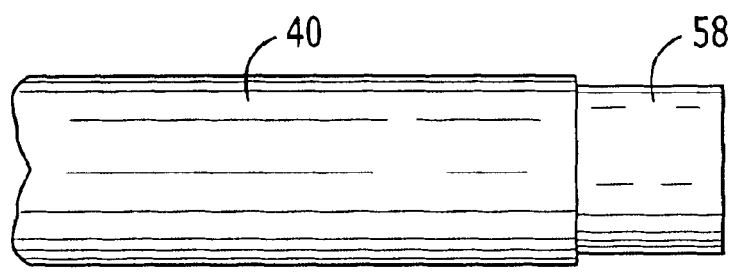
FIG. 6 is a fragmentary perspective view of an actuation shaft that includes a load cell according to one embodiment of the present invention.

In order to gather additional information about the performance of the switch 12, the embodiment of the actuator 40 that includes an actuator shaft that physically contacts the switch may include a force measurement device 58, such as a button load cell. See, for example, FIG. 6. By monitoring the output of the force measurement device, the spring force of the switch required to actuate the switch including separately the force required to break the connection between the normally closed and common contacts 52, 54 and the force required to make a connection between the normally open and common contacts 56, 54 may also be determined.

Figure 7:
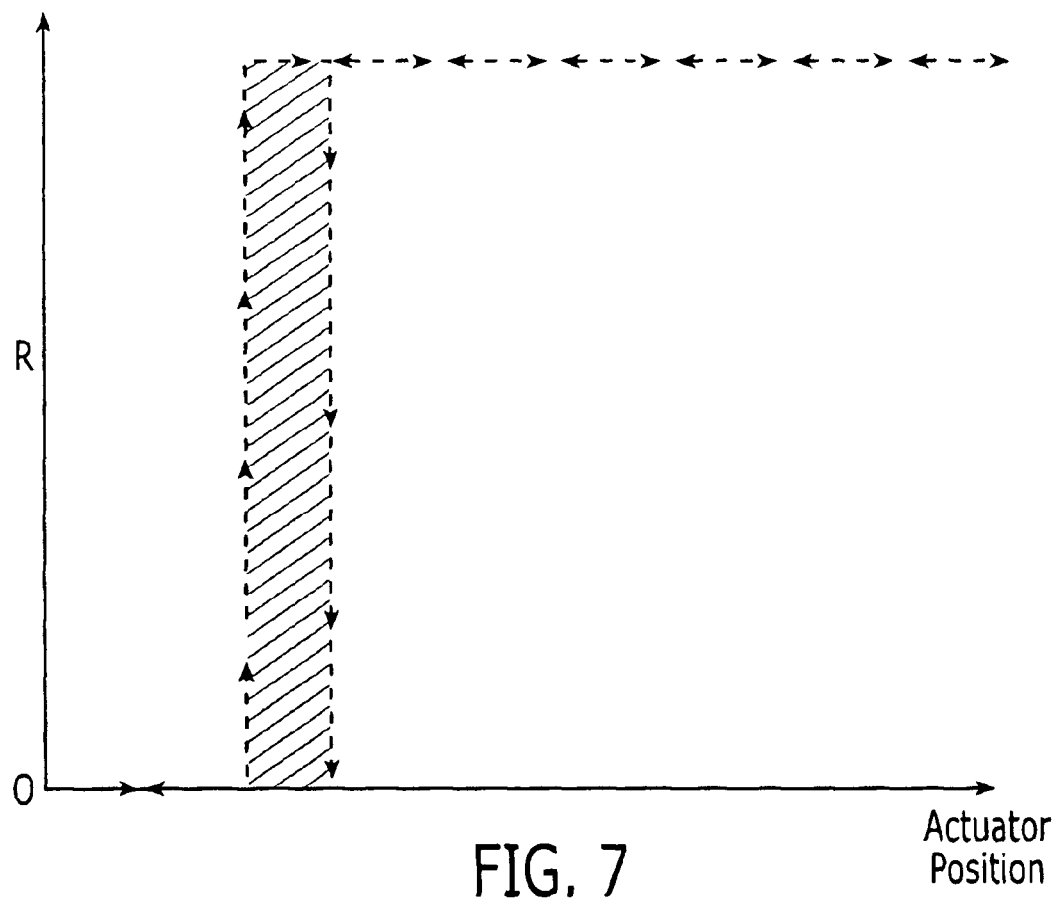
FIG. 7 is a graphical representation of a switch parameter, such as electrical resistance, as a function of actuator position, which illustrates the impact of hysteresis.

The hysteresis of a switch 12 may also be determined by the test apparatus 10 of the present invention. In this regard, the process described above in conjunction with the breaking of the connection between the normally closed and common contacts 52, 54 and the making of a connection between the normally open and common contacts 56, 54 of a single-pole, double throw switch may be reversed, such as by releasing the plunger, such that the connection between the normally open and common contacts is broken and the connection between the normally closed and common contacts is reestablished. By monitoring the electrical condition of the switch and, in particular, by measuring the electrical resistance between the normally open and common contacts and between the normally closed and common contacts, as well as by monitoring the position of the actuation shaft, the position of the actuation shaft when the connection that was previously established between the normally open and common contacts is broken and the connection between normally closed and common contacts is reestablished may be determined. By comparing the difference between the position of the actuation shaft when the connection between the normally closed and common contacts was initially broken and the position of the actuation shaft when the connection between the normally closed and common contacts is reestablished, as well as the difference between the position of the actuation shaft when a connection between the normally open and common contacts was initially made and the position of the actuation shaft when the connection between the normally open and common contacts is again broken, the hysteresis of the switch may be determined. One example of the hysterisis effect associated with the normally closed contact of a switch is graphically depicted in FIG. 7 which shows that the actuation shaft is at somewhat different positions as the connection between the normally closed and common contacts is made and then broken.

Although the testing of a single pole, double throw switch 12 by the apparatus 10 of the present invention has been described herein above by way of example, the apparatus is also suitable for testing single throw switches, double pole switches and other types of switches as mentioned above.

Regardless of the type of switch, the same switch 12 may be repeatedly tested over the course of its lifetime. By maintaining records evidencing the performance parameters of the switch from tests conducted at different points during the lifetime of the switch, changes in one or more of these performance parameters over time can be detected. For example, some switches include a silicon-based potting compound that outgases over time and creates a film on the switch contacts. This film may change the performance of the switch somewhat over time and at different temperatures and eventually may cause problems with respect to the proper functioning of the switch. By comparing the performance parameters of the switch over time, changes in the performance parameters and, in particular, changes in the performance parameters that are indicative of degradation of the overall performance of the switch may be noted such that the switch may be replaced, repaired or the like prior to failure of the switch.

As such, the test apparatus 10 of the present invention provides for the precise measurement of a number of performance parameters that characterize the overall performance of a switch 12. Thus, the test apparatus may advantageously be utilized to initially qualify a switch for an application, to monitor the performance and to detect any performance degradation over the life of the switch and to troubleshoot a system including one or more switches following the failure of the system. As described above, the test apparatus is quite robust in that a large number of performance parameters are measured, each with significant precision, such that detailed analysis of the performance of the switch may be conducted.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An apparatus for testing a switch comprising:
   a stage upon which the switch is mounted;
   a micrometer assembly comprising:
      an actuator shaft for actuating the switch to thereby alter a state of the switch; and
      a micrometer capable of manual actuation for controllably positioning said actuation shaft relative to the switch such that said actuation shaft actuates the switch; and
   a measurement device for monitoring an electrical condition of the switch as the state of the switch is altered.

2. An apparatus according claim 1 wherein said measurement device also monitors travel of said actuation shaft.

3. An apparatus according to claim 2 wherein the switch is one of a single throw switch and a double throw switch, and wherein said measurement device monitors pre-travel, differential travel and over-travel of the switch.

4. An apparatus according to claim 1 wherein said measurement device is adapted to monitor a measure representative of an electrical resistance between at least two contacts of the switch.

5. An apparatus according to claim 1 wherein said measurement device is adapted to monitor hysteresis of the switch as the state of the switch is again altered so as to return to an initial state.

6. An apparatus according to claim 1 further comprising:
   a base; and
   an upstanding member mounted upon said base and adapted for movement in a first direction relative to said base, wherein said stage is mounted to said upstanding member and adapted for movement in a second direction relative to said upstanding member.

7. An apparatus according to claim 1 wherein said actuation shaft comprises a load cell for obtaining a proportional electrical measure of force applied to the switch by said actuation shaft.

8. An apparatus according to claim 1, further comprising a linear displacement transducer for providing an electrical representation of a position of the actuator shaft.

9. An apparatus according to claim 1 further comprising at least one connector selected from the group consisting of a bolt and as screw that extends through an opening defined by the switch and engages said stage for mounting the switch thereupon.

10. An apparatus according to claim 1 wherein said actuator comprises a magnetic field generator for actuating the switch.

11. An apparatus for testing a switch comprising:
    a mounting assembly comprising:
       a base;
       an upstanding member mounted upon said base and adapted for movement in a first direction relative to said base; and
       a stage upon which the switch is mounted, wherein said stage is mounted to said upstanding member and adapted for movement in a second direction relative to said upstanding member;
    an actuator for actuating the switch to thereby alter a state of the switch; and
    a positioning device for controllably positioning at least one of said actuator and said stage such that said actuator actuates the switch.

12. An apparatus according to claim 11 wherein said actuator comprises an actuation shaft.

13. An apparatus according to claim 12 wherein said actuation shaft comprises a load cell for obtaining a measure of force applied to the switch by said actuation shaft.

14. An apparatus according to claim 12 wherein said positioning device comprises a micrometer that is capable of manual actuation for controllably positioning said actuation shaft relative to the switch.

15. An apparatus according to claim 11 further comprising a measurement device for monitoring an electrical condition of the switch as the state of the switch is altered.

16. An apparatus according to claim 15 wherein said measurement device also monitors travel of said actuator.

17. An apparatus according to claim 16 wherein the switch is one of a single throw switch and a double throw switch, and wherein said measurement device monitors pre-travel, differential travel and over-travel of the switch.

18. An apparatus according to claim 15 wherein said measurement device is adapted to monitor a measure representative of an electrical resistance between at least two contacts of the switch.

19. An apparatus according to claim 11 wherein said measurement device is adapted to monitor hysteresis of the switch as the state of the switch is again altered so as to return to an initial state.

20. An apparatus according to claim 11 wherein said mounting assembly further comprises at least one connector selected from the group consisting of a bolt and as screw that extends through an opening defined by the switch and engages said stage for mounting the switch thereupon.

21. An apparatus according to claim 11 wherein said actuator comprises a magnetic field generator for actuating the switch.

22. An apparatus for testing a switch comprising:
    a stage upon which the switch is mounted;
    an actuator for actuating the switch to thereby alter a state of the switch, wherein said actuator comprises a magnetic field generator for actuating the switch;
    a positioning device for controllably positioning at least one of said actuator and said stage relative to the other such that said actuator actuates the switch; and
    a measurement device for monitoring travel of at least one of said actuator and said stage and for also monitoring an electrical condition of the switch as the state of the switch is altered.

23. An apparatus according to claim 22 further comprising at least one connector selected from the group consisting of a bolt and as screw that extends through an opening defined by the switch and engages said stage for mounting the switch thereupon.

24. An apparatus according to claim 22 wherein the switch is one of a single throw switch and a double throw switch, and wherein said measurement device monitors pre-travel, differential travel and over-travel of the switch.

25. An apparatus according to claim 22 wherein said positioning device comprises a micrometer that is capable of manual actuation for controllably positioning said actuation shaft relative to the switch.

26. An apparatus according to claim 22 further comprising:

a base; and an upstanding member mounted upon said base and adapted for movement in a first direction relative to said base, wherein said stage is mounted to said upstanding member and adapted for movement in a second direction relative to said upstanding member.

* * * * *